US011604224B1

(12) United States Patent
Tsironis

(10) Patent No.: US 11,604,224 B1
(45) Date of Patent: Mar. 14, 2023

(54) HIGH SPEED CALIBRATION METHOD FOR IMPEDANCE TUNER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 207 days.

(21) Appl. No.: 16/987,260

(22) Filed: Aug. 6, 2020

(51) Int. Cl.
| | | |
|---|---|---|
| *G01R 31/319* | (2006.01) | |
| *H03H 7/40* | (2006.01) | |
| *H01P 5/04* | (2006.01) | |
| *G01R 27/26* | (2006.01) | |
| *H01C 10/38* | (2006.01) | |
| *G06F 17/40* | (2006.01) | |
| *G01R 31/28* | (2006.01) | |
| *H02P 8/34* | (2006.01) | |

(52) U.S. Cl.
CPC ..... *G01R 31/3191* (2013.01); *G01R 27/2676* (2013.01); *G01R 31/31905* (2013.01); *G06F 17/40* (2013.01); *H01C 10/38* (2013.01); *H01P 5/04* (2013.01); *H03H 7/40* (2013.01); *G01R 31/2822* (2013.01); *H02P 8/34* (2013.01)

(58) Field of Classification Search
None
See application file for complete search history.

(56) References Cited

U.S. PATENT DOCUMENTS

| | | | |
|---|---|---|---|
| 7,135,941 B1 | 11/2006 | Tsironis | |
| 9,625,556 B1 | 4/2017 | Tsironis | |
| 2004/0119481 A1* | 6/2004 | Tsironis | ................. G01R 27/32 324/637 |

OTHER PUBLICATIONS

Load Pull [online] Wikipedia [Retrieved Nov. 18, 2016] Retrieved from Internet <URL: http://en.wikipedia.org/wiki/Load_pull>.
"Computer Controlled Microwave Tuner, CCMT", Product Note 41, Focus Microwaves Inc. 1998, pp. 2-4.
"Three-Probe Tuners Tackles Multiple Tasks", Microwaves & RF Magazine, Feb. 2005, p. 90ff.
S—parameters [online], Microwave101.com [retrieved on Apr. 28, 2020] Retrieved from Internet <URL: https://www.microwaves101.com/encyclopedias/s-parameters>.
What is a Vector Network Analyzer and how does it work? [online], Tektronix [retrieved on Jun. 10, 2020] Retrieved from Internet <URL: https://www.tek.com/document/primer/what-vector-network-analyzer-and-how-does-it-work>.
Regula Falsi [online], Wikipedia [retrieved on Jul. 16, 2020]. Retrieved from Internet <URL: https://en.wikipedia.org/wiki/Regula_falsi>.

* cited by examiner

*Primary Examiner* — Nasima Monsur

(57) ABSTRACT

A fast calibration method for slide-screw impedance tuners employs a new tuner control board and routine with independent direct triggering and data sampling by the VNA; a new vertical scaling algorithm bypasses the traditional iterative approach and uses numerical curve-fitting and ISO circle definition. Full tuner calibration executes without motor stopping, yielding time reduction typically by a factor of 8.

8 Claims, 12 Drawing Sheets

HIGH SPEED CALIBRATION METHOD FOR IMPEDANCE TUNER

PRIORITY CLAIM

Not Applicable

CROSS-REFERENCE TO RELATED ARTICLES

1. Load Pull [online] Wikipedia [Retrieved 2016-11-18] Retrieved from Internet <URL: http://en.wikipedia.org/wiki/Load_pull>
2. "Computer Controlled Microwave Tuner, CCMT", Product Note 41, Focus Microwaves Inc. 1998, pages 2-4.
3. Tsironis C, U.S. Pat. No. 7,135,941, "Triple probe automatic slide screw tuner and method"
4. "Three-Probe Tuners Tackles Multiple Tasks", Microwaves & RF Magazine, February 2005, page 90ff.
5. Tsironis C., U.S. Pat. No. 9,625,556, "Method for Calibration and Tuning with Impedance Tuners", FIG. 12, column 5, line 1-43.
6. S-parameters [online], Microwave101.com [retrieved on 2020-04-28]. Retrieved from Internet <URL: https://www.microwaves101.com/encyclopedias/s-parameters>.
7. What is a Vector Network Analyzer and how does it work?" [online], Tektronix [retrieved on 06/10/2020] Retrieved from Internet <URL: https://www.tek.com/document/primer/what-vector-network-analyzer-and-how-does-it-work>.
8. Regula Falsi [online], Wikipedia [retrieved on 2020-07-16]. Retrieved from Internet <URL: https://en.wikipedia.org/wiki/Regula_falsi>.

BACKGROUND OF THE INVENTION

This invention relates to computer controlled pre-calibrated microwave impedance tuners used in load pull testing of microwave power transistors (see ref. 1); the tuners (see ref. 2, 3, 4) synthesize user-defined reflection factors (or impedances) and may conjugate-match the internal impedance of the transistors (device under test, or DUT) at the input to the source and/or at the output to the load at the fundamental and harmonic frequencies. Modern design of high-power microwave amplifiers, requires accurate knowledge of the active DUT characteristics under the actual power and impedance operating conditions, extracted using specialized test setups employing the impedance tuners and other connected test equipment, also called load pull characterization (see ref. 1 and FIG. 1).

Electromechanical tuners used in load pull measurements are mostly "slide screw tuners" which use a slotted low loss transmission airline (slabline) with an input (test) port, an output (idle) port and a center conductor and one (see ref. 2 and FIG. 3) or more (see ref. 4) metallic tuning probes, that are remotely stepper-motor-controlled and can be precisely inserted (Y) into the slot of the slabline, between full withdrawal (Y=0) and maximum proximity to the center conductor (Y=$Y_{MAX}$), in order to create a controlled reflection factor, standing wave ratio (VSWR) or RF impedance Z=Real(Z)+j*Imag(Z) (FIG. 4). The phase of the reflection factor is controlled by horizontal movement of the tuning probe along the slabline between initialization (X=0) and one half of a wavelength (X=$X_{MAX}$=λ/2(F)) at the test frequency F. The actual positions of the tuning probes are determined by counting the steps of controlling stepper motors relative to electronically detected limit switches that define their initialization state (zero positions). There are equivocal relations between these quantities: VSWR= (1+|Γ|)/(1−|Γ|); Z=Zo*(1+Γ)/(1−Γ); VSWR values range between 1 and ∞, reflection factor Γ=|Γ|*exp(jΦ) between 0≤|Γ|≤1 and 0≤Φ≤π, leading to Z between 0Ω and (∞±j*∞) Ω. Electro-mechanical slide screw tuners as shown in FIG. 3 are used for high power load pull testing, because they have long-term stability, higher handling of RF power, easier operation and lower cost, compared to other types of tuners.

The tuners create controlled impedance by moving the tuning probe to a unique cartesian X,Y position in an open loop configuration. This means there is no live feed-back information between the stimulus (the impedance set by the tuner in the test setup) and the actually synthesized impedance. This causes the measurement accuracy to depend exclusively on the tuner quality, which means the following: (a) the tuner must be mechanically repeatable; (b) the tuner must be calibrated before being used and (c) the calibration data must be saved and recalled during the measurement procedure. Tuner calibration means that the various states of the tuner are measured using a vector receiver (usually a vector network analyzer, see ref. 7) and the data are saved and retrieved later to be associated with DUT characteristics, in order to create ISO contour plots over the Smith chart that can be used for RF and microwave network design. This means, when the tuner is directed to generate a given reflection factor $S_{11}$, it must be able to do so within a certain error Δ, typically better than 1% (−40 dB) defined as Δ=10*lg(|S11.tuned−S11.calibrated|$^2$).

DESCRIPTION OF PRIOR ART

Tuner calibration, as any calibration, is the process of comparing the states of an instrument or device (here the tuner) to be calibrated with a calibration standard and saving the data, so they can be recalled and used to correct the value of instrument readings, extracting accurately the response of the device under test (transistor, DUT). In the case of electro-mechanical tuners (FIG. 3), calibration is the measurement of the tuner's two-port scattering (s-) parameters (see ref. 6), using a vector network analyzer (VNA) as shown in FIG. 2 for a multitude of tuning probe positions X,Y, and saving in tuner calibration files. For a general-purpose tuner calibration, the probe-positions shall be selected in such a manner as to generate reflection factors covering a large part of the normalized reflection factor area (the Smith chart), FIG. 4. This requires horizontal probe movement (parallel to the slabline) of at least one half a wavelength ($X_{MAX}$=λ/2) at the operation frequency F to cover 360° of phase, and vertical (perpendicular to the slabline) movement between a state of full withdrawal (Y=0) to a position as close to the center conductor as mechanically controllable, or short before a mechanical contact (Y=$Y_{MAX}$), to vary the reflection factor amplitude from minimum to maximum. The reflection factor generated by the penetration of the probe into the slabline depends on the individual tuner apparatus, is unknown in detail before the calibration and must, therefore, be experimentally determined each time. This critical vertical search movement procedure is called "scaling" and determines the probe penetration $Y_i$ settings for generating selected reflection factor magnitude levels ISO; once this is done and for each $Y_i$=const. position a group of calibration points forming a concentric reflection factor circle on the Smith chart (FIG. 4) are measured. Each $Y_i$ setting creates a new circle in a single probe trace from X=0 to X=$X_{MAX}$.

Slide screw impedance tuners are calibrated using vector network analyzers (VNA), FIG. 2. Calibration occurs at a limited number of settings corresponding to reflection factor points, which are best uniformly distributed over the Smith chart. However, in real measurement operation the calibrated points will not allow to tune to every desired impedance, even if the number of calibrated points is higher than 1,000. Only appropriate interpolation between calibrated points allows taking advantage of the high mechanical resolution of the slide screw tuners; a typical electro-mechanical tuner (see ref. 2) can generate the several hundred thousand up to millions of impedance states required for fine tuning at DUT reference plane; interpolation between calibrated anchor points, though, is accurate enough only when distributed on a dense grid of calibrated points, which leads to the requirement of thousands of calibrated anchor points. And this costs calibration time. In short, tuner calibration time (TCT) is the sum of probe movement time (PMT) and VNA reading time (VRT): TCT=PMT+VRT. The higher the frequency of operation, the smaller the wavelength $\lambda$ and the shorter PMT, but VRT remains constant, since, to acquire the data that cover the Smith chart, the VNA readings, including electronic VNA triggering via existing protocol (USB, LAN or GPIB), data generation and collection by the system controller, must be done point by point anyhow. Therefore, the PMT includes the time of traversing the X and Y probe movement space for all tuner calibration points as well as the time to accelerate and decelerate at each individually measured point. Additionally, the VRT includes both the total data transfer of all tuner s-parameters, and the communication overhead of each individually measured point (across the given communication protocol). So, to reduce calibration time, we need either (a) speed up individual data reading (typically built-in by the VNA manufacturer) or (b) reduce the number of movements and readings (leading to reduced calibration points and reduced accuracy) or (c) invent a third method. This third method overcomes these limitations, and is therefore the subject matter of this invention.

BRIEF SUMMARY OF THE INVENTION

This invention discloses a fast tuner calibration method, which allows equivalent tuning accuracy as a prior art full-scale calibration (see ref. 5) by exploiting the capacity of modern VNA for trigger synchronized measurement. In this case the VNA is externally triggered by the specialized tuner control electronics. In this way, the VNA measurements can be synchronized with the instantaneous tuner probe position without the need to stop the tuner at each measured point. Furthermore, the modern VNA can internally temporarily store all such synchronized measurements without requiring an individual instruction to the VNA to measure and download data at each calibrated point (FIG. 6). Therefore, the tuning probe can move continuously between the initialization point (X=0 or Y=0) to the maximum point $X=X_{MAX}=\lambda/2$ or $Y=Y_{MAX}$. The VNA measurement data is then retrieved all at once in a single data block transfer (which contains all the individual measurements).

This synchronized method applies both to the in-itself iterative and therefore prolonged vertical scaling (FIG. 12 in ref. 5) and the scanning of the Cartesian X-Y area of probe movement inside and along the slabline. The new method allows for calibration time reduction by a factor of, typically, 5 to 10. Throughout this disclosure the probe coordinates X, Y are expressed in integer number of motor steps (because of the use of stepper motor control). In reality they represent physical distances, but referring to motor steps generates a unifying description valid for all tuner geometries, where the mechanical gear converts motor (rotation) steps to mechanical linear movement. Vertical steps (Y) correspond typically to 1.5 µm/step; horizontal steps (X) vary with frequency and wavelength between 50 µm/step (at low frequencies) and 2.4 µm/step at very high frequencies, the objective being to have always a same order of magnitude number for $X_{MAX}$. When comparing with a physical size, for instance the wavelength, to motor steps, we use the closest integer number times the step size; for instance, if $\lambda$=100 mm and step size=21 µm, then $X_{MAX}=\lambda/2$=2,381 steps.

DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 6:
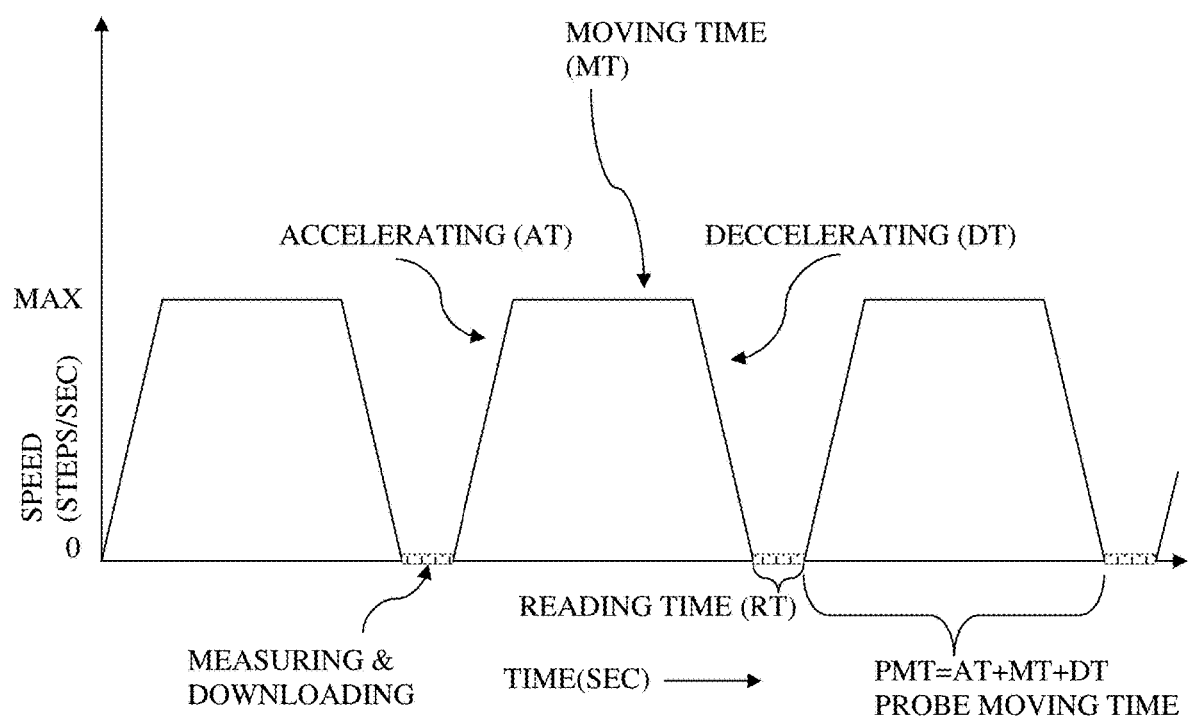
FIG. 6 depicts prior art, stepper motor speed profile for tuning probe control and the intervening data collection intervals where the motors stand still.

Up to now tuner calibration required the tuning probe to stop between calibration points, to allow the PC controller to send GPIB/USB or LAN commands to the VNA, to trigger a s-parameter measurement, download and store the data for each calibration point into PC memory and then proceed in moving the tuning probe to repeat the process. The motor movement speed profile has been improved over time to include a ramp up and down of the motor speed to reach higher top speed and avoid mechanical backlash and hysteresis, as shown in FIG. 6. It is obvious that AT, DT and RT (stop) times more than double the duration of the process. In fact, it is found that, depending on the frequency (at higher frequencies MT is smaller), the real time prolongation may exceed a factor of 5. To reduce this time-waste and accelerate the calibration, a synchronized triggering and data retrieval process is introduced, during which the VNA is measuring continuously the s-parameters, but holds data sets in internal memory only when asked to by an external trigger pulse.

Figure 1:
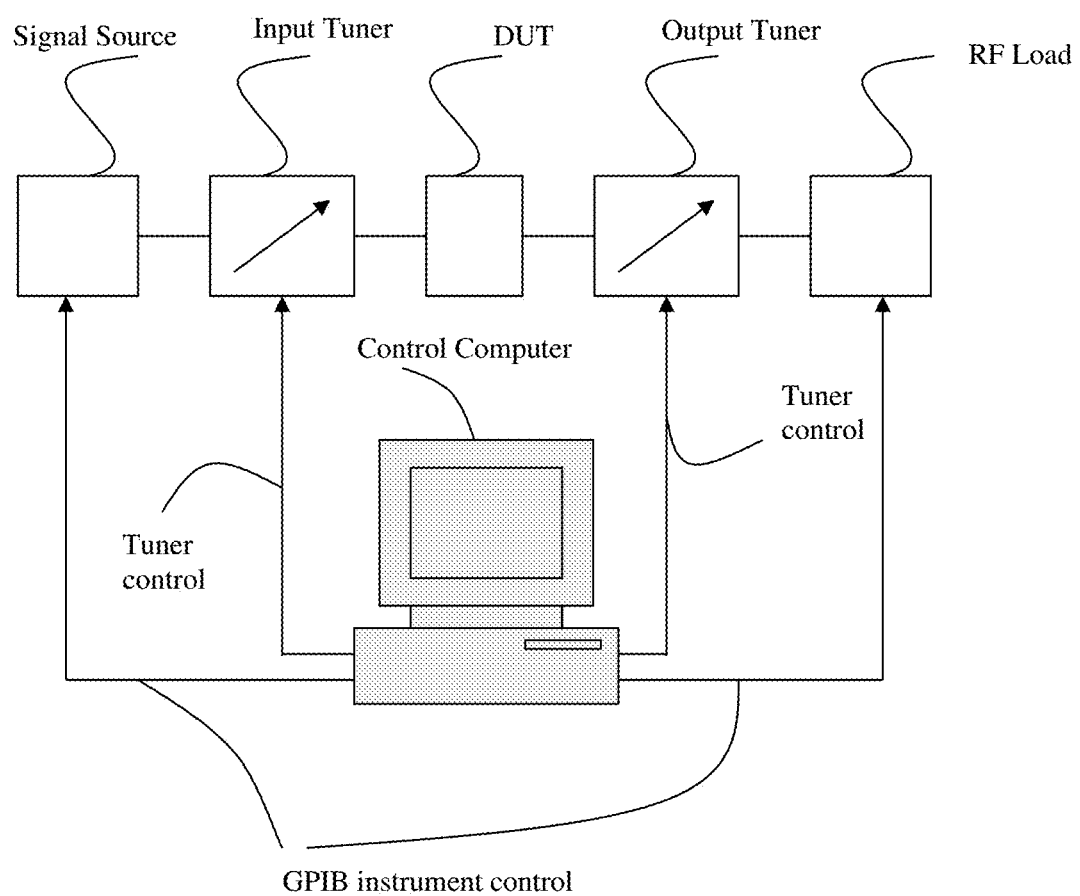
FIG. 1 depicts prior art, a typical load pull system.
Figure 2:
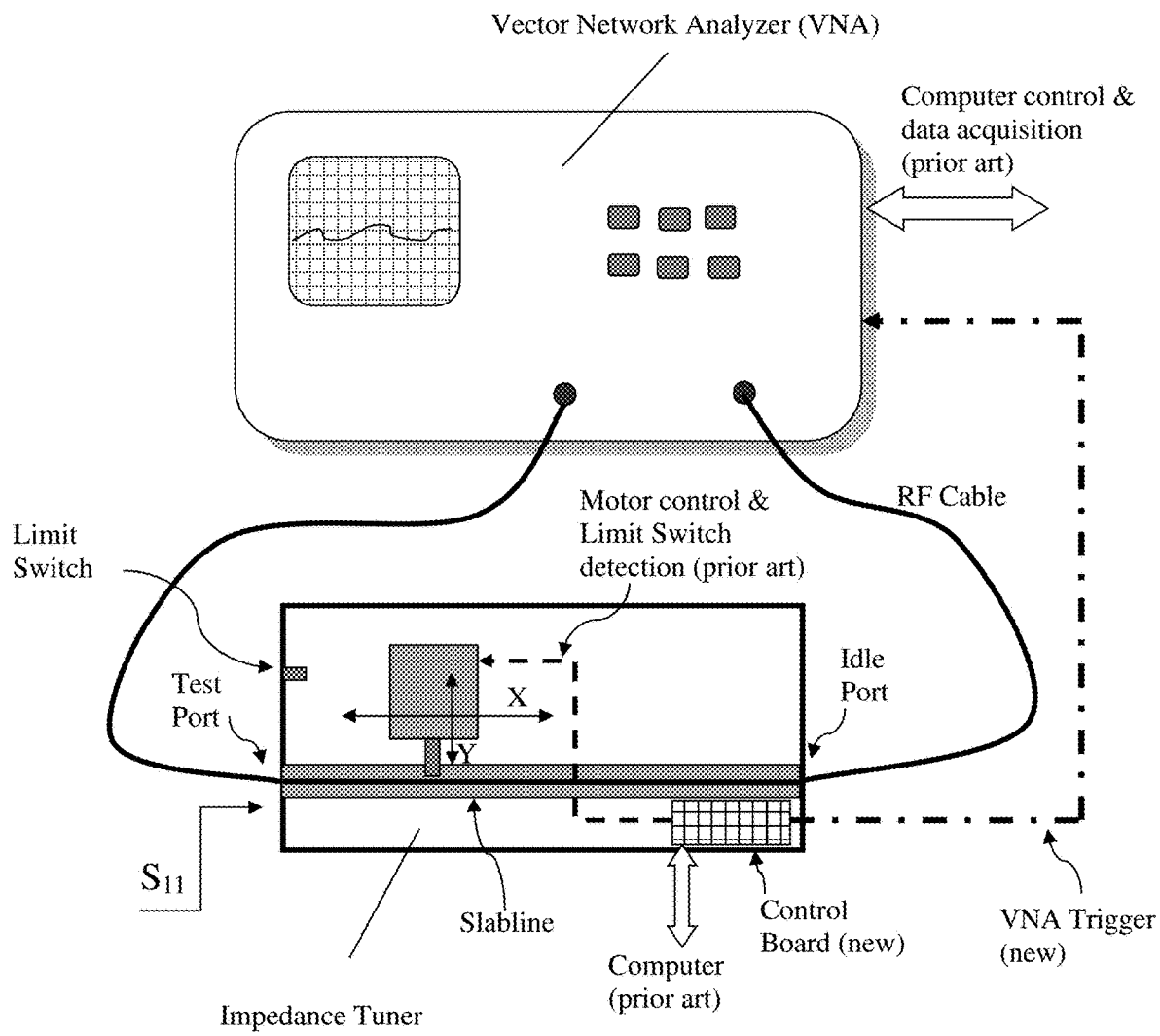
FIG. 2 depicts tuner, connection to VNA for calibration including prior art computer communication and new internal sampling trigger link.
Figure 3:
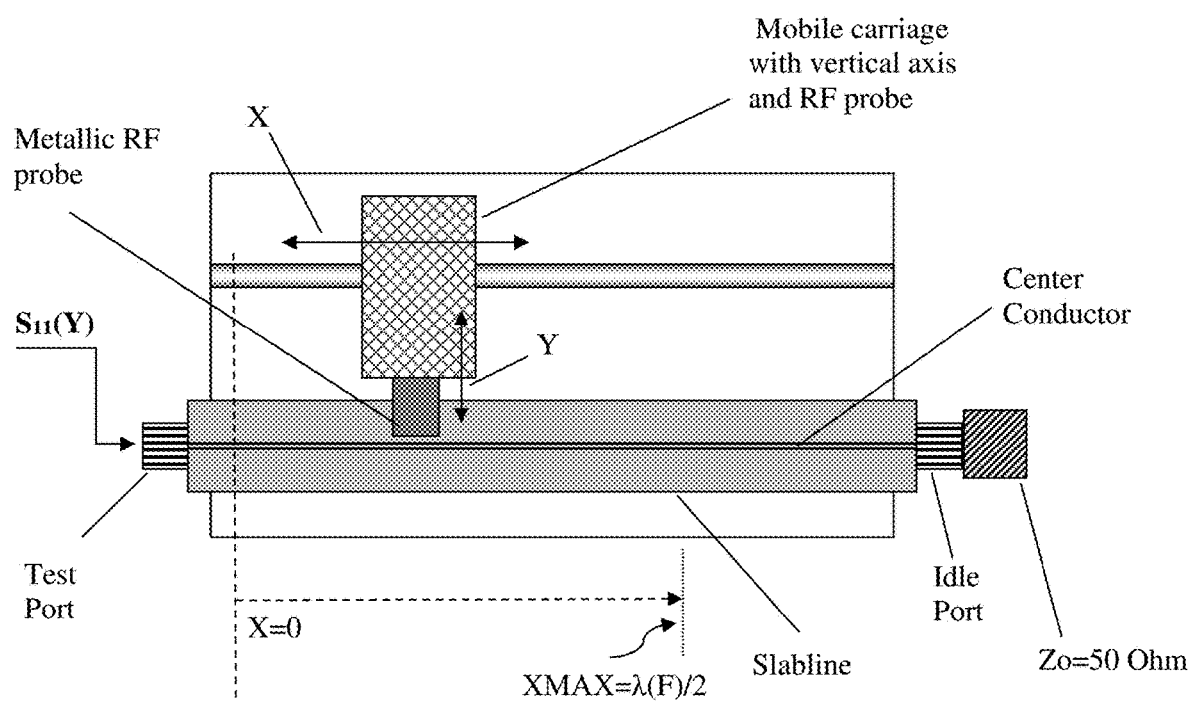
FIG. 3 depicts prior art, front view of single probe slide screw impedance tuner.
Figure 12:
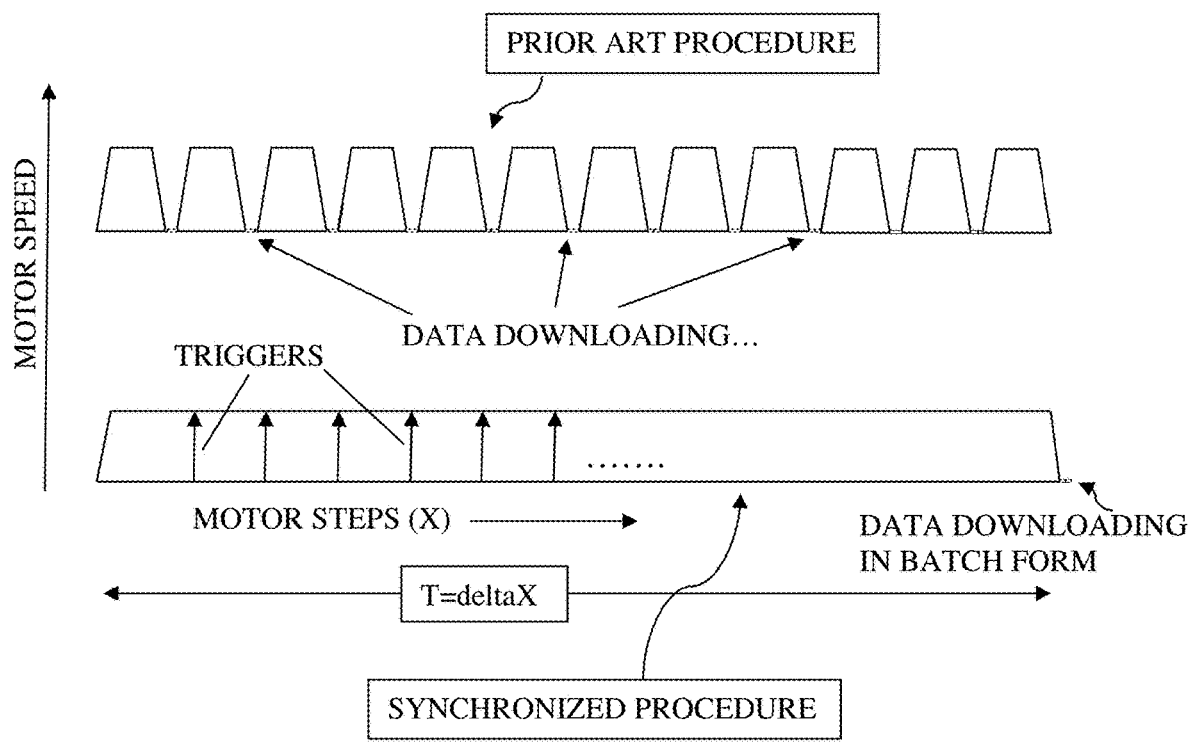
FIG. 12 depicts comparison of prior art and synchronized motor move and data triggering and downloading in batch form.

This trigger pulse is provided by a different link directly from the tuner control board (FIG. 2) and is emitted at certain blocks of number of motor steps (intervals, T=deltaX), when the motor control pulses (and probe position) have reached certain user pre-defined values, i.e. triggering a pulse every T motor steps (FIG. 12). For this the tuner control board has been re-designed from all prior art structures, which allow only motor control and limit switch detection for probe initialization by adding an electronic trigger output synchronization signal, typically in TTL—3.3V format. This signal, when received by the vector receiver, causes instantaneous internal data sampling and temporarily storing in internal memory, until, at a later point, another instruction via standard communication link directs the receiver to download the s-parameter data in block (batch) format, associate with the X and Y probe positions and save in the control computer.

Figure 7:
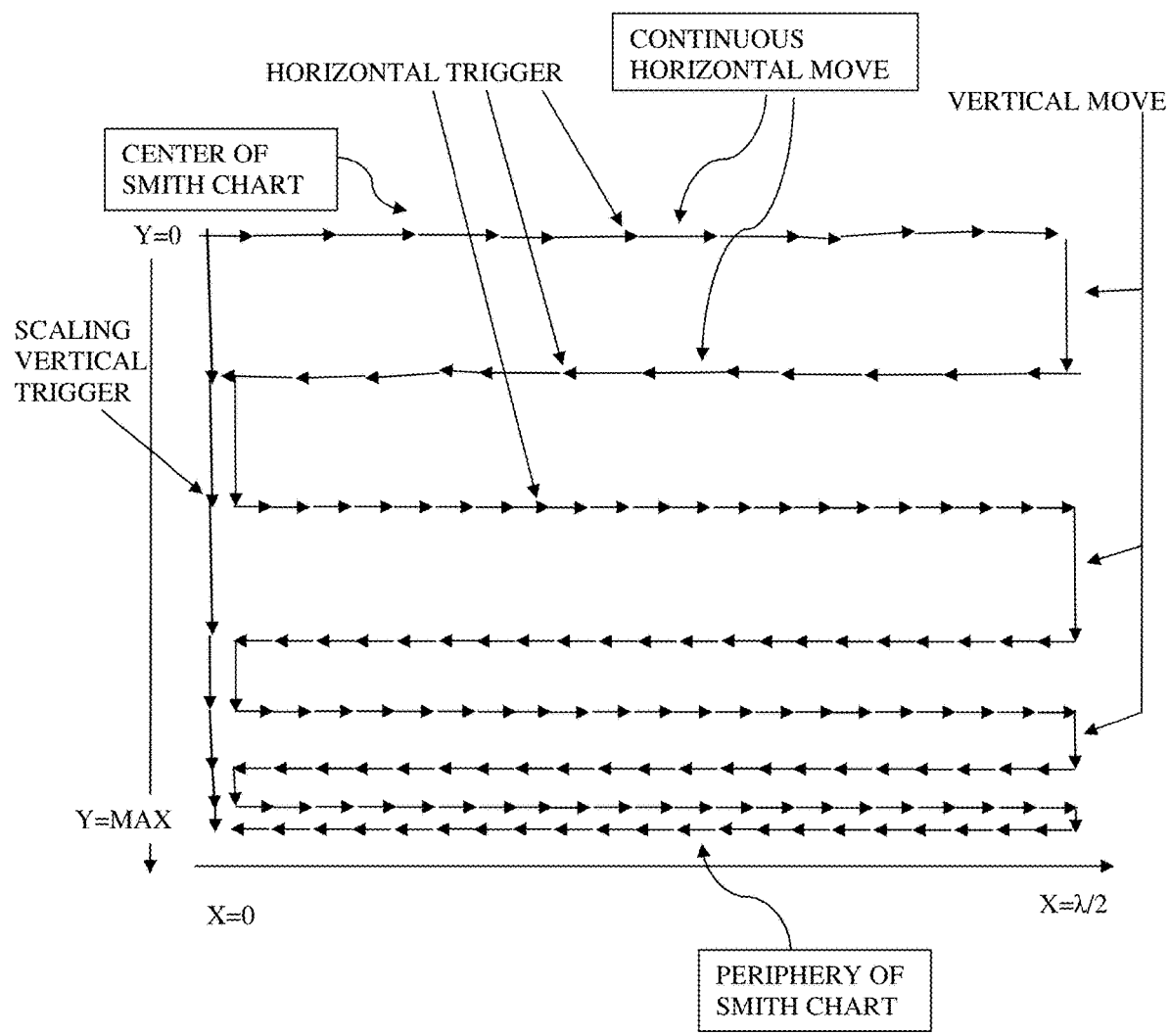
FIG. 7 depicts tuning probe trajectory for full fast calibration.

The hitherto used general type of command exchange via standard protocols (GPIB, USB, LAN etc.) follows strict hand-shaking and control-bit verification kind of communication protocol and is quite "bureaucratic" therefore slow. Internal command exchange and data sampling in the vector receiver is, instead, orders of magnitude faster and allows synchronous data detection during quasi continuous mechanical motor movement. At a typical motor speed of 500 steps/sec (a 1.8°/step motor rotates at 150 RPM), each motor step lasts 20 msec. whereas the triggering and internal receiver operation does not last more than a few milliseconds. This rough estimate shows the feasibility of the technique, that is, the possibility to trigger, sample and temporarily store data within a one-motor-step period. For instance, using an order of magnitude rough approximation, for one circle of calibration on the Smith chart (one row in FIG. 7), if the probe moves horizontally 5000 steps, but data samplings are triggered every T=125 steps, for a total of 40 occurrences, at a speed of 500 steps/sec this takes now, using the synchronized measurement method, a total time of 10 sec. Originally (FIG. 6), for AT=DT=0.4 sec, MT=1 sec and RT=0.01 sec, this would take 40*(0.4+0.4+0.01+1)=72.4 sec. or approximately 7 times longer.

The core of the new method is the tuner control and s-parameter collection procedure including three distinct actions: In a first action the PC controller instructs the new tuner control board to move a tuning probe to a horizontal and/or vertical position X, Y; during the probe movement the tuner control board emits, through the separate direct TTL link, at given deltaX or deltaY increments, a trigger signal to the vector network analyzer (VNA) to initiate internal s-parameter reading and temporary saving; then in a last step the PC controller communicates with the VNA and retrieves (downloads) the temporarily saved s-parameter data from the VNA in block format at intervals which are multiples of deltaX or delta Y. As an example, X triggering every deltaX=100 step intervals, s-parameter downloading every 100 deltaX triggers or 5000 steps.

The new tuner calibration method is made of the following two distinct and necessary steps, each including probe movements in the Cartesian X-Y space and data sampling and retrieval actions, triggered by the on-board tuner controller (FIG. 2) without changing the horizontal VH or the vertical VV probe moving speed. The method does not require the probe-carrying carriages or the vertical axes to decelerate and stop to launch a measurement action and data transfer from the VNA (FIG. 6).

In particular the time consuming vertical scaling routine is changed dramatically: Instead of setting a number N of $|S_{11}|$ target values from minimum to maximum and trying to fine-converging using a basic "regula-falsi" approach (see ref. 8), whereby the probe attempts to reach a target reflection factor value by moving proportional to the distance to the $|S_{11}|$ target and, if it overshoots, reversing in a spiral approach strategy, now the vertical scaling is done much faster numerically: The probe moves vertically from Y=0 (around the center of the Smith chart) to $Y=Y_{MAX}$ (close to the periphery of the Smith chart) at a steady pace VV and several $|S_{11}|$ data values are triggered for and saved temporarily internally in the background and then downloaded, when the VNA is instructed via GPIB or other protocol, in batch form, into the PC. The number of motor steps (DY) between trigger pulses defines the sampling interval and anchor point density and can vary, typically, from 5 to 25 steps.

Figure 8:
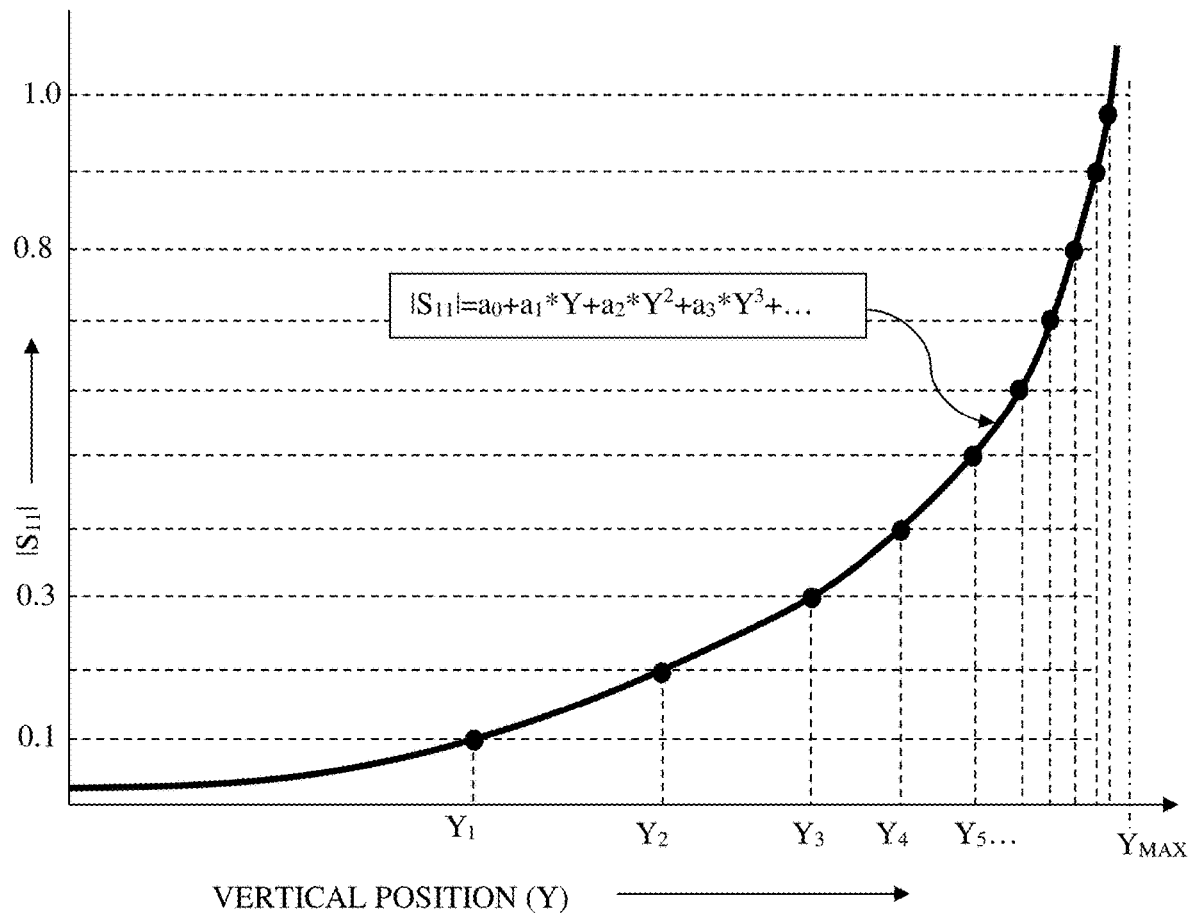
FIG. 8 depicts detailed curve fitting of reflection factor as a function of vertical probe position.

Then the coefficients a0, a1, a2, a3, . . . of a polynomial of at least third order $|S_{11}(Y)|=a0+a1*y+a2*y^2+a3*y^3+\ldots$ wherein $y=Y/Y_{MAX}$, are determined via best curve-fitting (FIGS. 5 and 8) and then the values $Y_i$ for the N preselected levels of reflection factor $|S_{11i}|$ (i.e. the radius of the reflection factor ISO circles, FIG. 4) are extracted and saved. The number N of ISO circles varies typical between 5 and 20. Values below 5 yield a spread calibration leading to inaccurate interpolation, whereas a number larger than 20 leads a longer calibration time.

Once the $Y_i$ settings for creating the preselected reflection factor levels have been determined and saved, the full characterization is initiated: the probe is moved in a meandering path (FIG. 7) between X=0 and $X=X_{MAX}=\lambda/2$, non-stop. During that movement, the motor control routine emits, at the configurable intervals (based on frequency and calibration density), trigger pulses through the tuner control board to the VNA, to execute the very fast sampling of s-parameter data.

Figure 4:
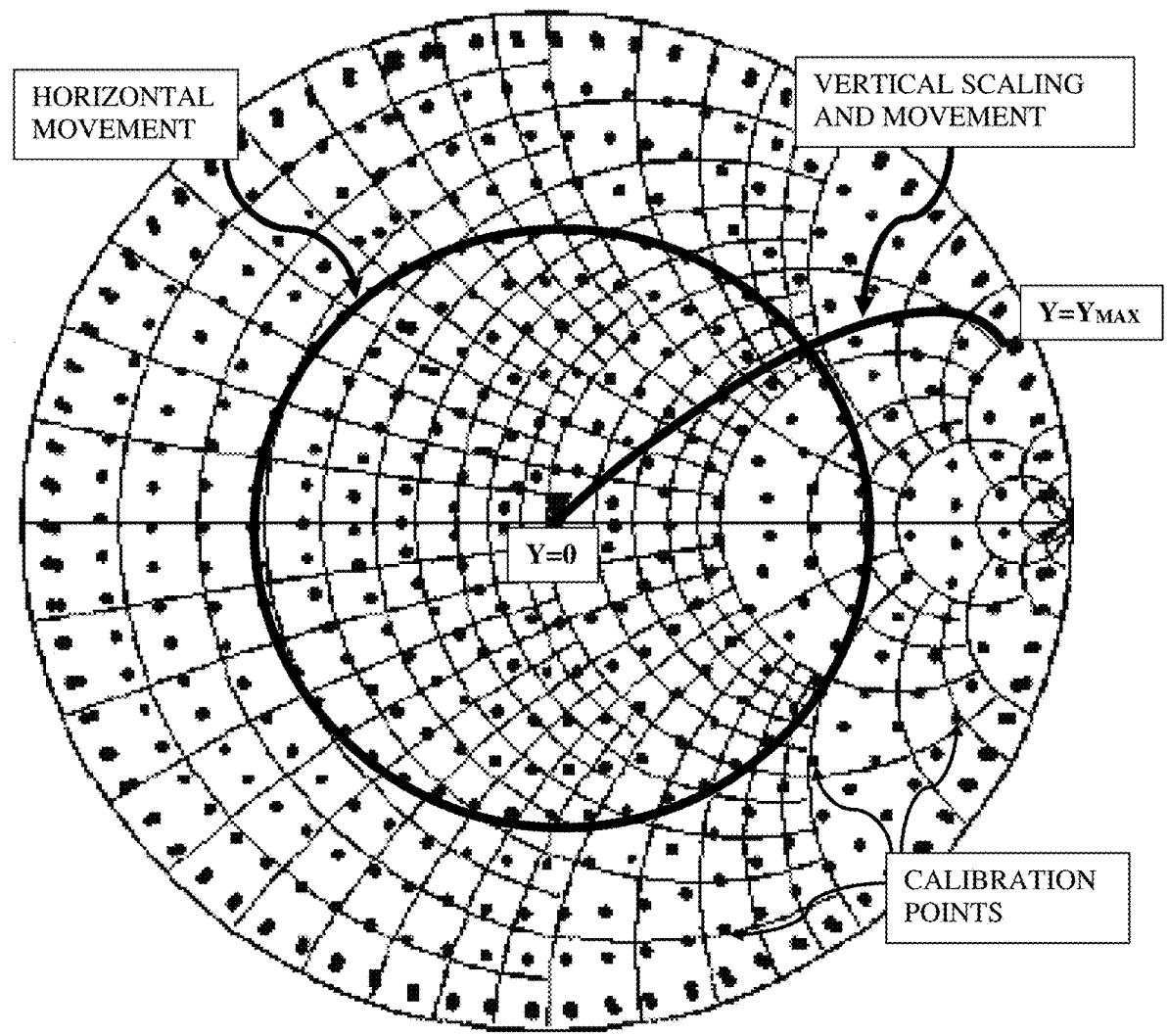
FIG. 4 depicts prior art, calibration points, vertical scaling and horizontal probe movement.
Figure 5:
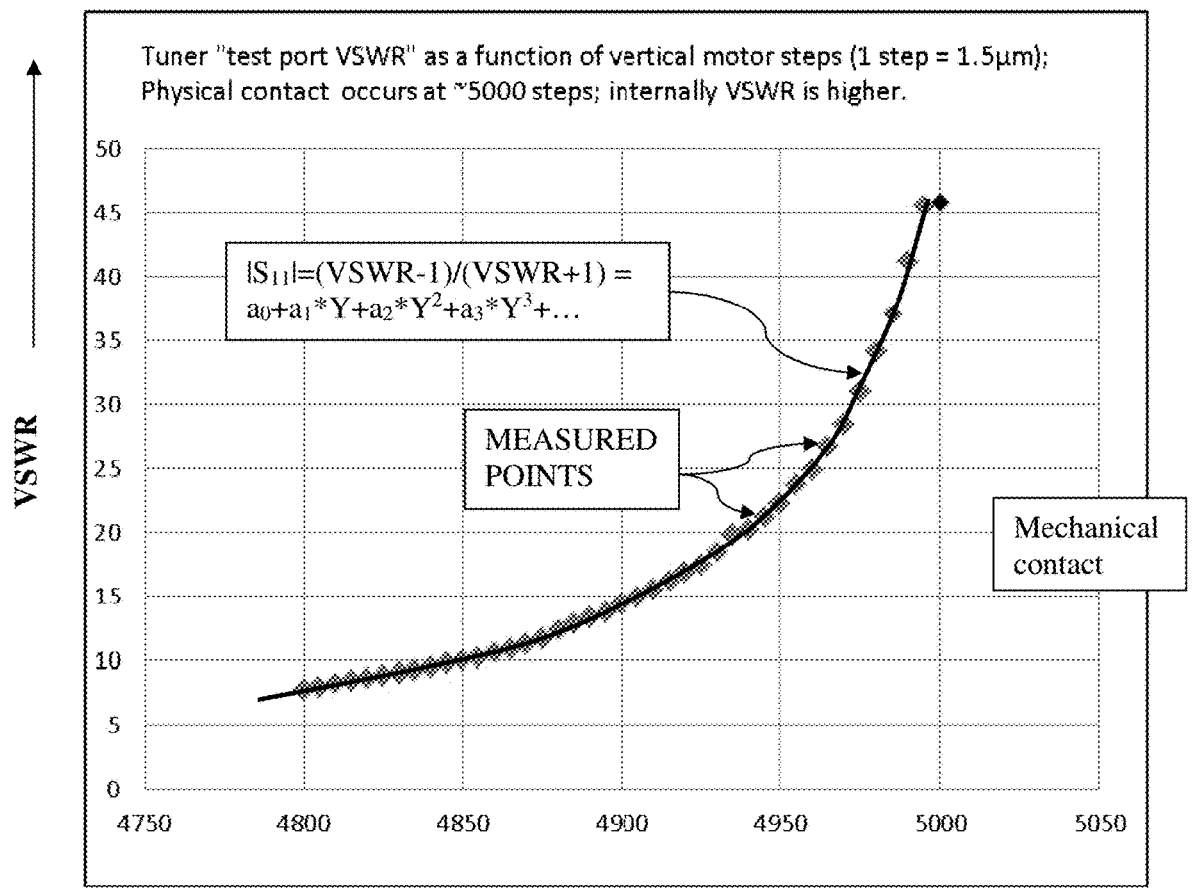
FIG. 5 depicts VSWR as a function of probe penetration (Y) and associated polynomial curve-fitting.

The triggering is launched at different times for each $S_{11}$ level, because the periphery of each circle is different and the objective is to keep the vector distance between calibrated points on the whole Smith chart roughly constant. A rule of thumb is to increase the number of triggers (NoT), that means the number of calibration points, proportional with the radius, based on a formula NoT=k*M, whereby k is the circle index (1 . . . N) and M is a point density factor ranging typically between 4 and 20. Lower density is possible but does not allow a dense enough point grid for accurate interpolation; a number higher than 20 creates a very dense grid leading to excess calibration time. For instance, if M=4, the first circle (k=1) will include NoT=4 points (triggers) and the 9th circle (k=N=9) it will include NoT=36 points (triggers). The result is an approximate equal arc distance of 10° at the last circle and a radial distance between circles of 0.1. In the case of FIG. 4 the values are selected to M=11, and N=9.

Figure 9:
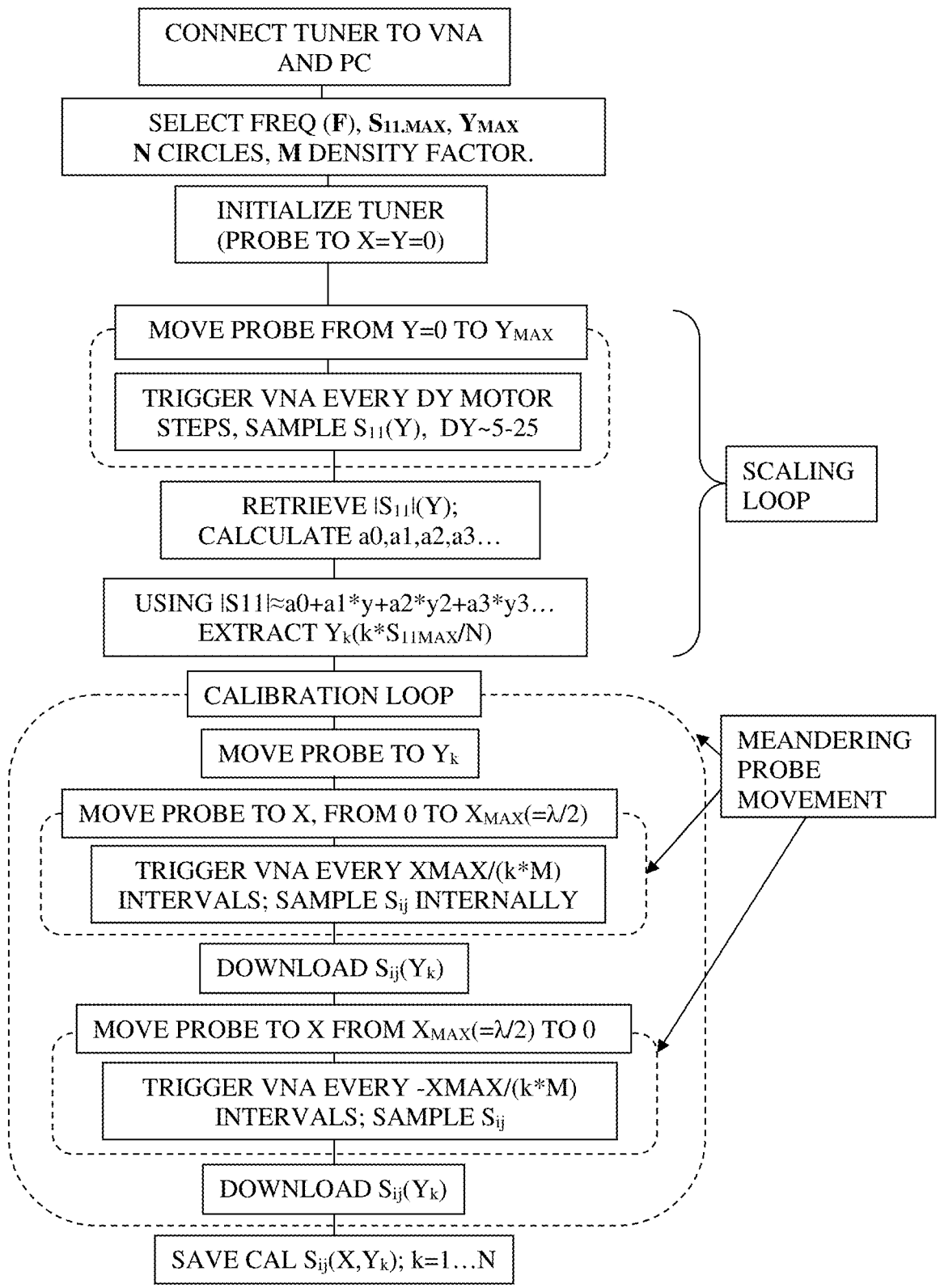
FIG. 9 depicts a flowchart of fast calibration.

The probe, as said, moves, for a full calibration of adequate point density, following a meandering path (FIG. 7) in Cartesian coordinates X,Y in an overall vertical loop from Y=0 to $Y=Y_{MAX}$ and inside this loop there is the horizontal movement loop of X, in a forward direction from X=0 to $X=X_{MAX}=\lambda/2$ and in reverse direction from $X=X_{MAX}=\lambda/2$ to X=0 (FIG. 9). If only a section of the Smith chart has to be covered $X_{MAX}$ may be less that $\lambda/2$. The VNA is independently triggered without the motors slowing or stopping and the synchronously detected s-parameter data are saved internally in the background in the VNA. Every time the probe reverses at X=0 or X=$X_{MAX}$ the data are downloaded into the control computer, since the intervening vertical probe move offers some idle time.

The downloaded data are added as rows to the calibration file for each $Y_i$. Using this method, a traditional tuner calibration with 15 tuner calibration circles would consist of approximately 1000 tuner positioning commands (starting and stopping at each measured point) and a corresponding 1000 VNA measurement commands (to measure each point individually). Under this newly invented method, this would be reduced to 30 tuner positioning commands, and 16 VNA measurement commands. More specifically, 1 positioning command and VNA measurement for the vertical scaling, 15 of each for each calibration circle, and 14 additional tuner positioning commands to transition between each calibration circle.

Figure 10:
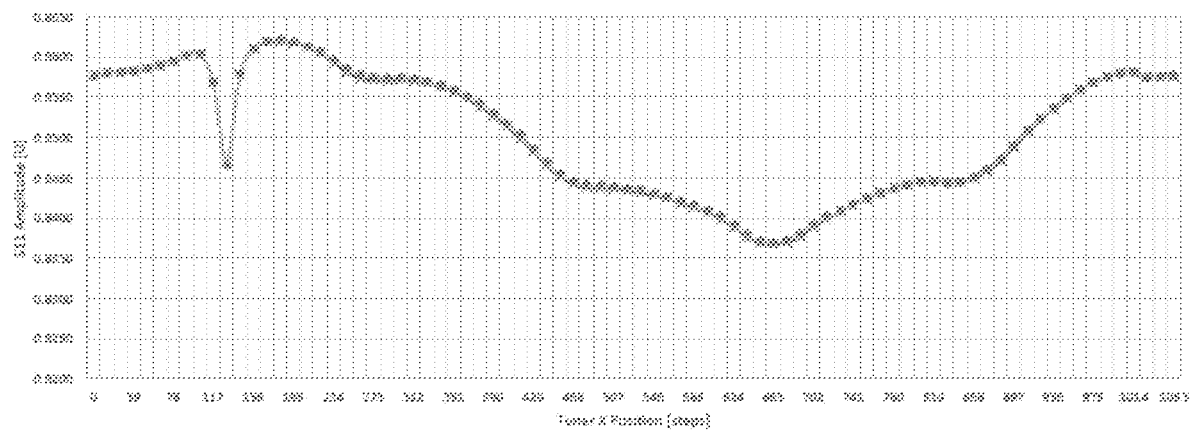
FIG. 10 depicts amplitude $|S_{11}|$ tracking of prior art step by step calibration versus a set of four successive fast calibration runs (showing a total of one prior art and 4 synchronized overlapping traces).
Figure 11:
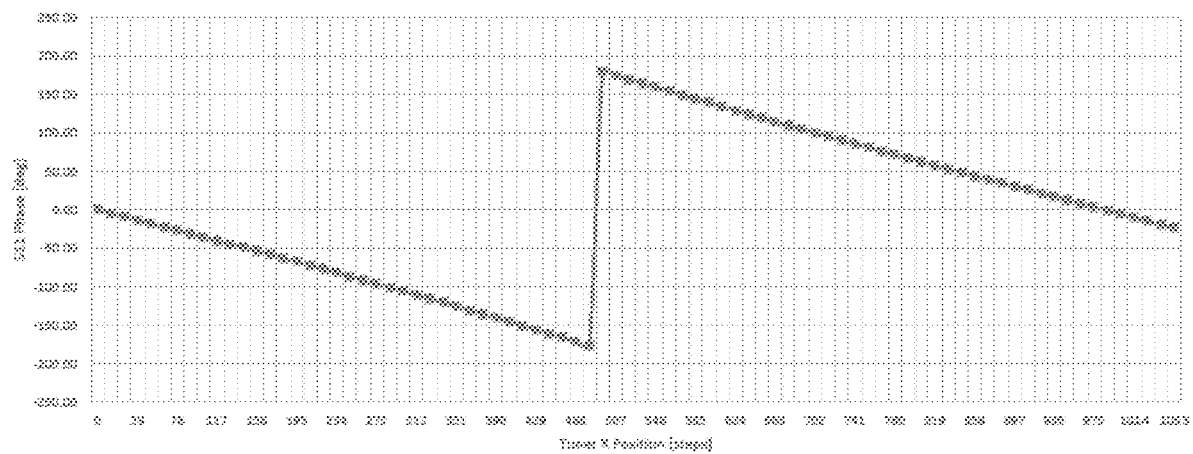
FIG. 11 depicts phase <S11 tracking of prior art step by step calibration versus a set of four successive fast calibration runs (showing a total of one prior art and 4 synchronized overlapping traces).

The accuracy of the new synchronized "non-stop" calibration is verified by comparing with the traditional "stop-measure-go" procedure of FIG. 6, that has been used for many years successfully. The results of such verification are shown in FIGS. 10 and 11. FIG. 10 shows the quasi perfect overlap of the $S_{11}$ amplitude of one prior art versus a repeated set of four traces of the new synchronized method and FIG. 11 shows the phase.

In both cases when comparing a one "stop-measure-go" run and four "non-stop" runs the difference found is undetectable. Timewise the new calibration routine is, at 6 GHz, more than 8 times faster than the prior art method (1' versus 8+'). At lower frequencies the ratio is higher than 8:1, at higher frequencies it is lower, because of the longer or shorter horizontal probe travel.

Although the present invention has been explained hereinabove by way of a preferred embodiment thereof, other combinations of the described components are possible and, as far as obvious to a person skilled in the art, they shall not limit the scope of the present invention.

What is claimed is:

1. A calibration method for computer-controlled slide screw impedance tuner, wherein
the slide screw impedance tuner comprises:
a test port,
an idle port,
a slabline with a center conductor between the ports and,
at least one stepper motor remotely controlled metallic RF tuning probe, insertable vertically (Y) into the slabline between full withdrawal (Y=0) and closest proximity to the center conductor (Y=$Y_{MAX}$), and movable horizontally (X) along the slabline from a position closest to the test port (X=0) to a position at least half a wave length X=$X_{MAX}$=λ(F)/2 further away, at a test frequency F; and
an electronic control board, configured to:
detect limit switches of horizontal and vertical tuning probe movement limits,
control the stepper motors, and
emit electronic trigger pulses to a vector network analyzer; and wherein the calibration method for the computer-controlled slide screw impedance tuner comprises:
(a) a data-sampling technique, wherein the vector network analyzer is triggered by electronic pulses, emitted by the electronic control board, during the mechanical movement of the at least one tuning probe to instantaneously retrieve and temporarily store internally s-parameter data of the slide screw impedance tuner corresponding to the instantaneous horizontal and vertical positions of the at least one tuning probe,
(b) a tuner control and s-parameter collection procedure, wherein the control computer controls the stepper motor and downloads, in batch format at pre-determined intervals, in the vector network analyzer internally temporarily saved S-parameter data;
(c) a reflection factor scaling method, wherein the control computer inserts gradually the at least one tuning probe vertically into the slabline, while measuring, registering and numerically describing a reflection factor at the test port as a function of the vertical position (Y) of the at least one tuning probe.

2. The calibration method for computer-controlled slide screw impedance tuner as in claim 1, wherein the data sampling technique comprises:
while the electronic control board directs the stepper motors to insert and move the at least one tuning probe to positions into and along the slabline, the said electronic control board emits, during the at least one tuning probe movement, at pre-determined intervals, electronic trigger pulses causing the vector network analyzer to instantaneously retrieve and temporarily store internally s-parameters of the slide screw impedance tuner corresponding to the instantaneous horizontal and vertical positions of the at least one tuning probe, until downloaded into the control computer in batch format and saved.

3. The calibration method for computer-controlled slide screw impedance tuner as in claim 1, wherein the tuner control and s-parameter collection procedure comprises:
(a) the control computer instructs the tuner control board to move the at least one tuning probe to a horizontal and/or vertical position X, Y;
(b) the tuner control board emits, at given horizontal deltaX or vertical deltaY increments, electronic trigger pulses to the vector network analyzer, causing it to initiate s-parameter reading and internal temporary saving;
(c) the control computer retrieves (downloads) s-parameter data from the vector network analyzer in batch format at multiples of deltaX or deltaY.

4. The calibration method for computer-controlled slide screw impedance tuner as in claim 2, wherein the reflection factor scaling method comprises the following steps:
(a) connect the tuner to the pre-calibrated vector network analyzer;
(b) define a number of reflection factor circles N and triggering intervals T in motor steps;
(c) initialize the at least one tuning probe by withdrawing it from the slabline, which defines Y=0, and placing it close to the test port, which defines X=0;
(d) in a movement-measurement loop:
inserting the at least one tuning probe gradually into the slot of the slabline from Y=0 to Y=$Y_{MAX}$ while triggering readings of the vector network analyzer at T number of motor step intervals and retrieving and temporarily saving reflection factor |$S_{11}$| data at the test port using the data sampling technique;
(e) creating a best-approximation polynomial function of at least third order for the reflection factor |S11| as a function of normalized vertical tuning probe position y=Y/$Y_{MAX}$;
(f) selecting at least N equidistant |S11.k| values, k=1, 2, 3 . . . N, between S11.min=S11(Y=0) and S11.max=S11(Y=$Y_{MAX}$), determine the associated vertical probe position Y.k from the polynomial function of step (e) and save |S11.k| with the associated Y.k value in a scaling table; wherein k is a circle index.

5. The calibration method for computer-controlled slide screw impedance tuner as in claim 4, comprising:
- (a) define a number M of points on reflection factor circle k, wherein M(Y.k)=k*P, with P=4 or 8 or 16 or 32 and k=1, 2, 3 . . . N;
- (b) initialize the at least one tuning probe to X=0 and Y=0;
- (c) in a vertical {Y} probe movement loop from Y=0 to Y=$Y_{MAX}$, move the at least one tuning probe to the vertical Y.k positions for k=1, 2, 3, . . . N, and in nested horizontal {X} probe movement loops from X=0 to X=$X_{MAX}$ for increasing X and from X=$X_{MAX}$ to X=0 for decreasing X:
- trigger internal s-parameter Sij.k(X,Y.k) readings from the vector network analyzer at int ($X_{MAX}$/M(Y.k)) horizontal step intervals, for {i,j}={1,2} and save temporarily; increase k, download the temporarily saved s-parameters from the vector network analyzer to the control computer and move the at least one tuning probe to Y.k;
- (d) save all s-parameters and associated X and Y positions of the at least one tuning probe in a tuner calibration file for later use.

6. The calibration method for computer-controlled slide screw impedance tuner as in claim 4, comprising:
- (a) define point density factors M(Y.k)=k*P, with P=4 or 8 or 16 or 32 and k=1, 2, 3 . . . N;
- (b) initialize the at least one tuning probe to X=0 and Y=0;
- (c) in a vertical {Y} probe movement loop from Y=0 to Y=$Y_{MAX}$, move the at least one tuning probe to the vertical Y.k positions for k=1, 2, 3, . . . N, and in nested horizontal {X} probe movement loops from X=0 to X=$X_{MAX}$; trigger internal s-parameter Sij.k(X, Y.k) readings from the vector network analyzer at int $X_{MAX}$/M(Y.k)) horizontal step intervals of the at least one tuning probe, for {i,j}={1,2} and save temporarily; download the temporarily saved s-parameters from the vector network analyzer to the control computer, increase k, return the at least one tuning probe to X=0, insert it to Y=Y.k and repeat the horizontal tuning probe movement from X=0 to X=$X_{MAX}$, the s-parameter reading and the temporarily saving;
- (d) save all s-parameters and associated X and Y tuning probe positions in a tuner calibration file for later use.

7. The calibration method for computer-controlled slide screw impedance tuner as in claim 4, wherein the number of reflection factor circles N is typically between 3 and 20.

8. The calibration method for computer-controlled slide screw impedance tuner as in claim 4,
wherein the horizontal movement limit of the at least one tuning probe is at least one half of a wavelength at the frequency F, $X_{MAX}$=λ(F)/2.

* * * * *